(12) United States Patent
Pio

(10) Patent No.: US 6,445,031 B1
(45) Date of Patent: Sep. 3, 2002

(54) BYTE-SWITCH STRUCTURE FOR EEPROM MEMORIES

(75) Inventor: Federico Pio, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/322,454

(22) Filed: May 28, 1999

(30) Foreign Application Priority Data

Jun. 3, 1998 (EP) .............................. 98830343

(51) Int. Cl.[7] .......................................... H01L 29/788
(52) U.S. Cl. ......................................... 257/316; 257/315
(58) Field of Search ............................. 257/316, 319, 257/314, 315, 318; 438/266, 201, 211, 257

(56) References Cited

U.S. PATENT DOCUMENTS

| | | | |
|---|---|---|---|
| 4,907,198 A | * 3/1990 | Arima | 365/185 |
| 5,049,516 A | * 9/1991 | Arima | 437/43 |
| 5,554,867 A | 9/1996 | Ajika et al. | 257/314 |
| 5,605,853 A | 2/1997 | Yoo et al. | 437/43 |
| 5,612,913 A | * 3/1997 | Cappelletti et al. | 365/185.12 |
| 5,990,514 A | * 11/1999 | Choi et al. | 257/315 |

FOREIGN PATENT DOCUMENTS

EP  0 409 042 A2  1/1991

OTHER PUBLICATIONS

Pfiester, James, R., et al. "A Self–Aligned Elevated Source/ Drain MOSFET," *IEEE Electron Device Letters*, vol. 11, No. 9, Sep. 1990, pp. 365–367.

* cited by examiner

*Primary Examiner*—Steven Loke
*Assistant Examiner*—Douglas W. Owens
(74) *Attorney, Agent, or Firm*—Lisa K. Jorgenson; Robert Iannucci; Seed IP Law Group PLLC (57) ABSTRACT

A byte-switch structure for electrically erasable and programmable non-volatile memories, includes a MOS transistor having a drain electrode coupled to a respective metal control gate line, a source electrode coupled to a respective polysilicon byte control line which is connected to control gate electrodes of all the memory cells of a same memory byte or word and is formed in an upper polysilicon layer, and a gate electrode coupled to a respective word line. The source and drain electrodes of the MOS transistor are respectively a first and a second doped regions of a first conductivity type formed in a semiconductor layer of a second conductivity type at opposite sides of the respective word line. The first and second doped regions are formed under the respective metal control gate line, and the polysilicon byte control gate line insulatively extends under the metal control gate line to overlap said first doped region, and contacts the first doped region through a respective contact opening in an underlying stack formed by an interpoly dielectric layer, a lower polysilicon layer and an oxide layer.

7 Claims, 7 Drawing Sheets

United States Patent
US 6,445,031 B1

BYTE-SWITCH STRUCTURE FOR EEPROM MEMORIES

TECHNICAL FIELD

The present invention relates to Electrically Erasable and Progranimable non-volatile semiconductor memory devices, shortly referred to as EEPROMs. More specifically, the invention concerns a new structure of a byte-switch for EEPROMs, having a more compact layout and therefore allowing for a save in semiconductor area.

BACKGROUND OF THE INVENTION

As known, EEPROMs are arranged per bytes or per words. This arrangement makes it possible to modify the memory content on a per-byte or, respectively, per-word basis, a feature that makes EEPROMs particularly useful in some applications if compared to, e.g., Flash EEPROMs.

This feature is achieved because the control gate of each single memory byte or word is physically distinct from those of the other memory bytes or words, and can be individually addressed in writing, erasing and reading.

Figure 1:
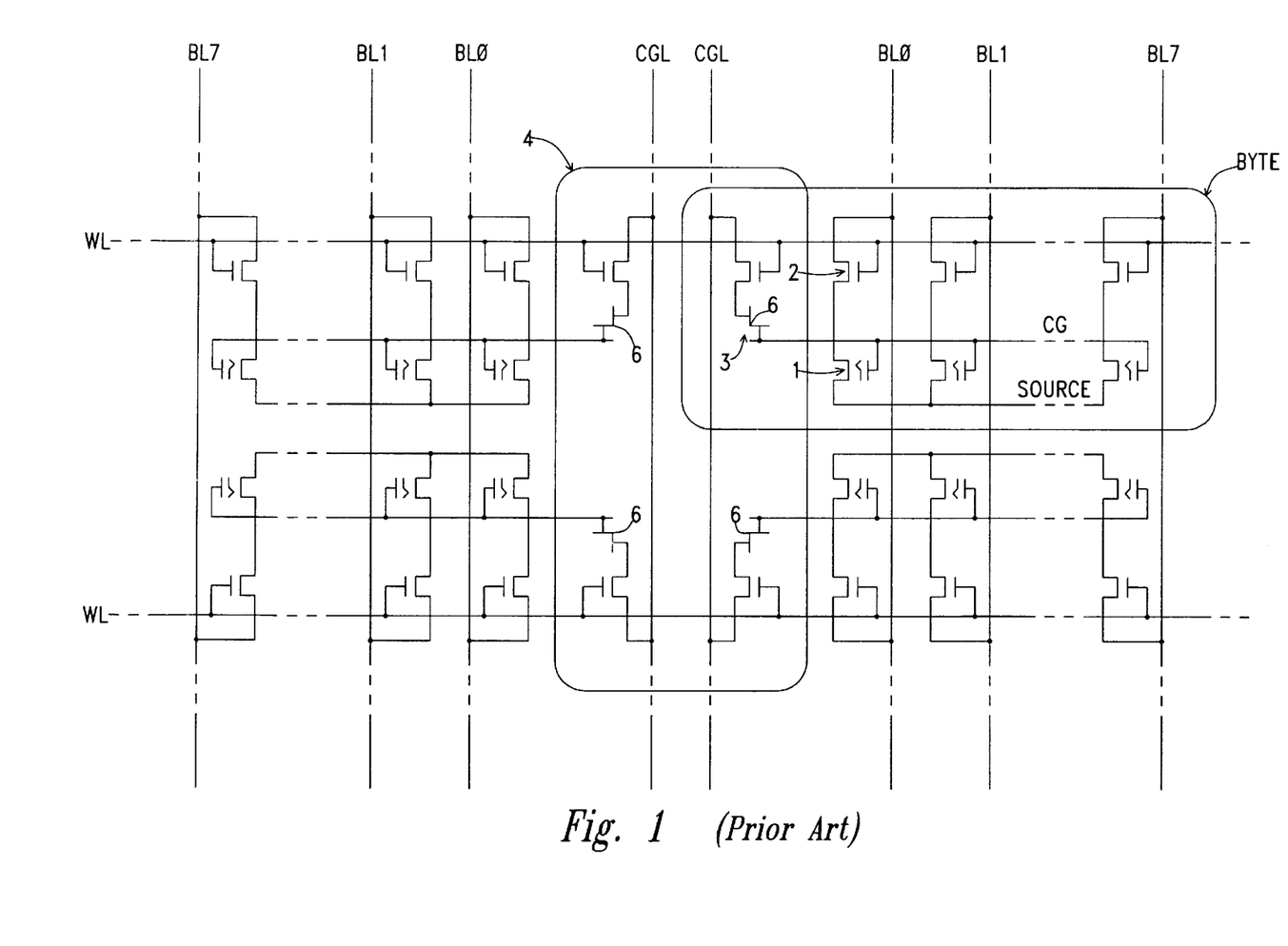
FIG. 1 is a circuit diagram of a portion of a conventional EEPROM memory cell array including four bytes with the associated byte-switches.

FIG. 1 shows a circuit diagram of a portion of a conventional EEPROM memory cell array. The portion depicted in FIG. 1 comprises four memory bytes. Each byte is-connected to a respective control gate line CGL, made of aluminum. Each memory cell of the byte comprises a floating-gate tunnel-oxide MOS transistor 1 in series to a select MOS transistor 2. The drain electrode of the select transistor 2 is connected to a respective bit line BL0–BL7, made of aluminum. The gate electrodes of the select transistors 2 of all the memory cells of a same byte are connected to a same word line WL, made of polysilicon. The source electrodes of the floating-gate transistors 1 of all the memory cells of a same byte are connected together. The control gate electrodes of the floating-gate transistors 1 of all the memory cells of a same byte are connected to a common byte control gate CG of polysilicon and the latter, through a respective byte-switch 3, is in turn connected to the respective control gate line CGL. The byte-switch 3 comprises a MOS transistor having a drain electrode connected to the control gate line CGL, a gate electrode connected to the word line WL, and a source electrode electrically coupled to the byte control gate CG.

Conventionally, selection circuits for selecting the word lines WL, the control gate lines CGL and the bit lines BL0–BL7 are provided externally to the memory cell array.

Selection of a memory byte is achieved by biasing the respective control gate line CGL, biasing the respective word line WL, and biasing the respective bit lines BL0–BL7. In this way, through the byte-switch 3, the voltage on the control gate line CGL is transferred to the byte control gate CG and thus to the control gate electrodes of the floating-gate transistors 1. The voltage put on the word line WL activates the select transistors 2. Consequently, the drain electrodes of the floating-gate transistors 1 are connected to the respective bit lines BL0–BL7. The other bytes connected to the same control gate line CGL are not affected, since they are connected to a different word line WL. The other bytes connected to the same word line WL are not affected, since they are connected to a different control gate line CGL. Thus, only one byte is effectively addressed.

Figure 2:
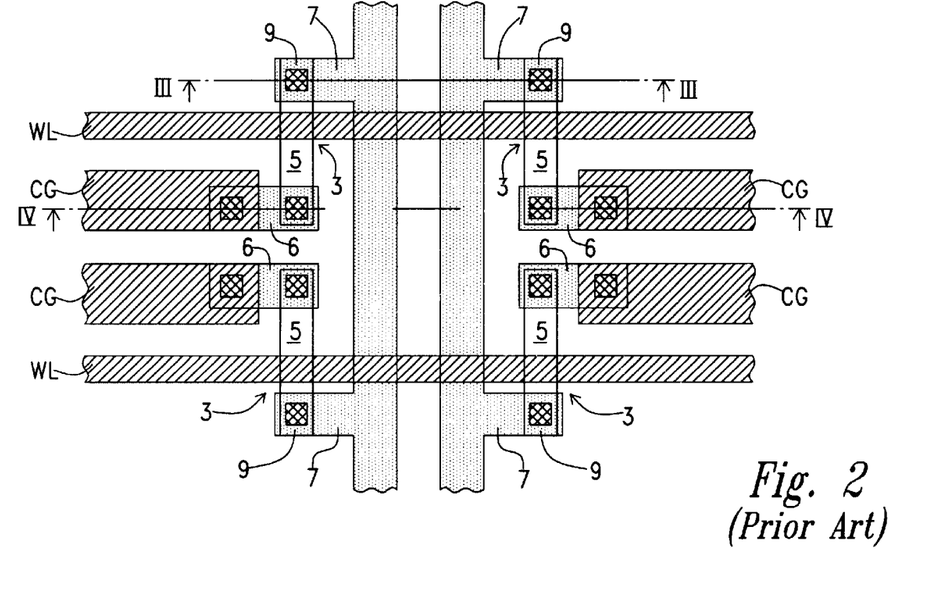
FIG. 2 shows the conventional layout of the four byte-switches shown in FIG. 1.

FIG. 2 shows the layout of the detail 4 in FIG. 1, i.e. the byte-switches of four memory bytes. As visible, the structure is symmetrical with respect to both the vertical axis and the horizontal axis. The aluminum control gate lines CGL have lateral extensions 7 which, through contact openings in a dielectric layer 8 (FIGS. 3 and 4), contact an underlying N type diffusion 9 forming the drain electrode of the byte-switch MOS transistor. Electrical connection between the source electrode N type diffusion 5 of the byte-switch MOS transistor 3 and the respective polysilicon byte control gate CG is achieved by means of an aluminum jumper 6 which, through contact openings in the dielectric layer 8, contacts the source electrode diffusion 5 and the polysilicon byte control gate CG, short-circuiting them. The byte control gate CG is formed out of an upper polysilicon level, a lower polysilicon level 11 being used for forming the floating gates of the floating-gate transistors 1. Conventionally, thick field oxide areas 12 separates the active areas of the chip.

Since both the control gate lines CGL and the jumpers 6 are formed out of a same aluminum layer, the distance between them must be sufficient for preventing shorts between the control gate lines CGL and the jumpers 6. It is for this reason that the control gate lines CGL have lateral extensions 7.

It appears clearly that the provision of the byte-switches determines an overhead in the area dedicated to the memory cell array. However, such an overhead cannot be prevented, if the feature of byte or word individual selection is to be maintained. Another fact to be considered is that each byte-switch must to be located adjacent to the respective byte, in other words, the byte-switches cannot be located externally to the memory cell array.

Figure 3:
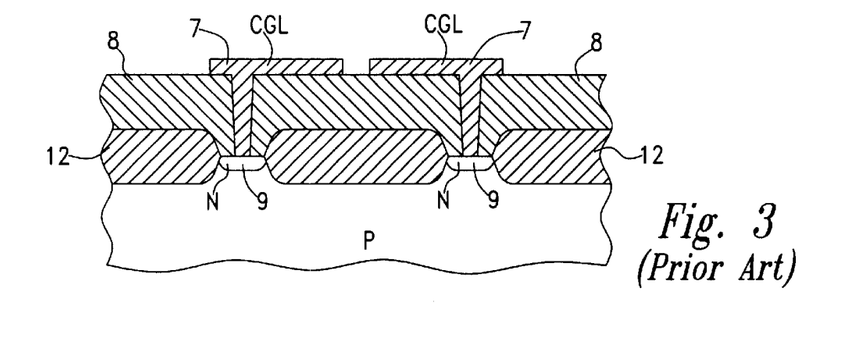
FIG. 3 is a cross-section along line III—III of FIG. 2.
Figure 4:
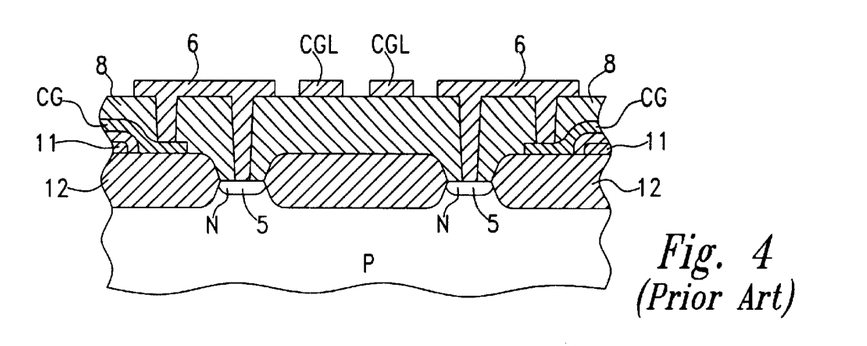
FIG. 4 is a cross-section along line IV—IV of FIG. 2.
Figure 5:
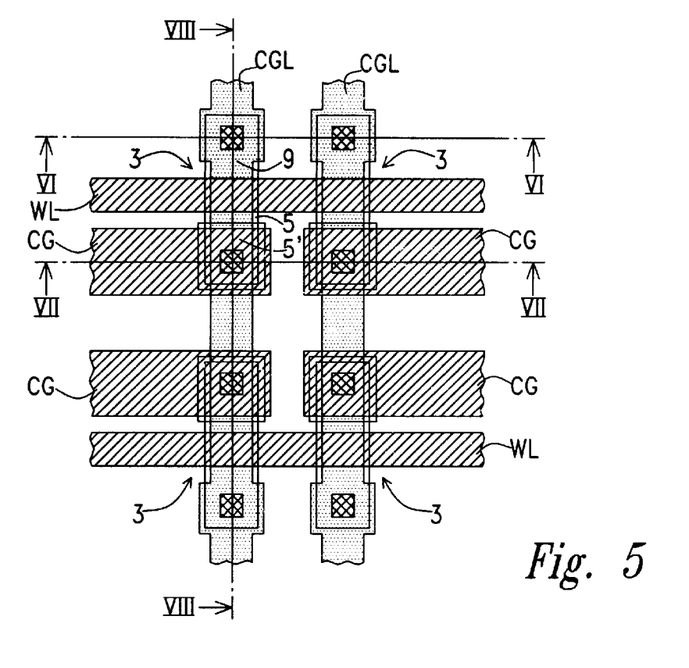
FIG. 5 shows a layout of four byte-switches in accordance with a first embodiment of the invention.

FIGS. 2 to 4 show the situation in the case a manufacturing process is used providing for only one metal interconnection level. However, the situation in terms of area does not change even if a process providing for two metal interconnection layers is used. In fact, one of the two metal layers is normally used to shunt the polysilicon word lines WL so as to reduce the resistivity thereof. Additionally, even if more compact contact arrangements were used (e.g., stacked contacts and vias), which however introduce critical steps in the manufacturing process, the area occupied by the byte-switches is not significantly reduced. Several of the well known processing steps have been omitted for brevity. Examples of most of the omitted steps can be found in Silicon Processing for the VLSI Era, Volume 1: Process Technology, Stanley Wolf and Richard Tauber, Lattice Press, 1986; and Silicon Processing for the VLSI Era, Volume 2; Process Integration, Stanley Wolf, Lattice Press, 1990, both of which are hereby incorporated by reference.

SUMMARY OF THE INVENTION

In view of the state-of art described, it is an advantage of the present invention to provide a new structure for a byte-switch suitable for reducing as far as possible the unavoidable overhead of silicon area.

According to embodiments of the present invention, such an advantage is achieved by a byte-switch structure for electrically erasable and programmable non-volatile memories, including a MOS transistor having a drain electrode coupled to a respective metal control gate line, a source electrode coupled to a respective polysilicon byte control gate line which is connected to control gate electrodes of all the memory cells of a same memory byte or word and is formed in an upper polysilicon layer, and a gate electrode coupled to a respective word line. The said source and drain electrodes of the MOS transistor are, respectively, first and second doped regions of a first conductivity type formed in a semiconductor layer of a second conductivity type at opposite sides of said respective word line. These first and second doped regions are formed under the respective metal control gate line. Additionally, the polysilicon byte control gate line insulatively extends under the metal control gate line to overlap the first doped region, and contacts the first doped region through a respective contact opening in an underlying stack formed by an interpoly dielectric layer, a lower polysilicon layer and an oxide layer.

The proposed byte-switch structure allows for a significant reduction of the chip area overhead. A byte-switch according to embodiments of the invention occupies an area which is approximately a half that occupied by a conventional byte-switch.

BRIEF DESCRIPTION OF THE DRAWINGS

The features and advantages of the invention will be made apparent by the following detailed description of two embodiments thereof, illustrated by way of non-limiting example only in the annexed drawings.

DETAILED DESCRIPTION OF THE INVENTION

Figure 7:
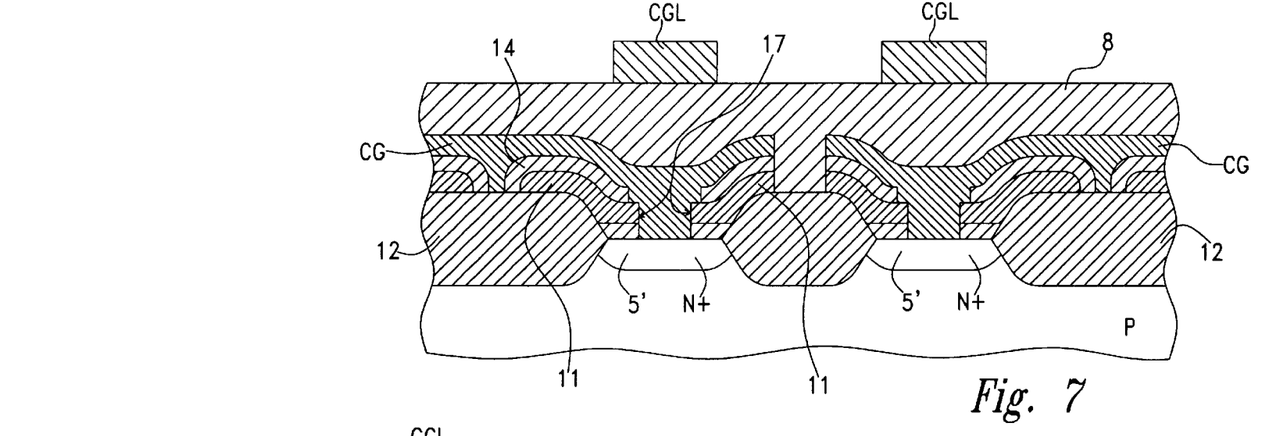
FIG. 7 is a cross-section along line VII—VII of FIG. 5.
Figure 8:
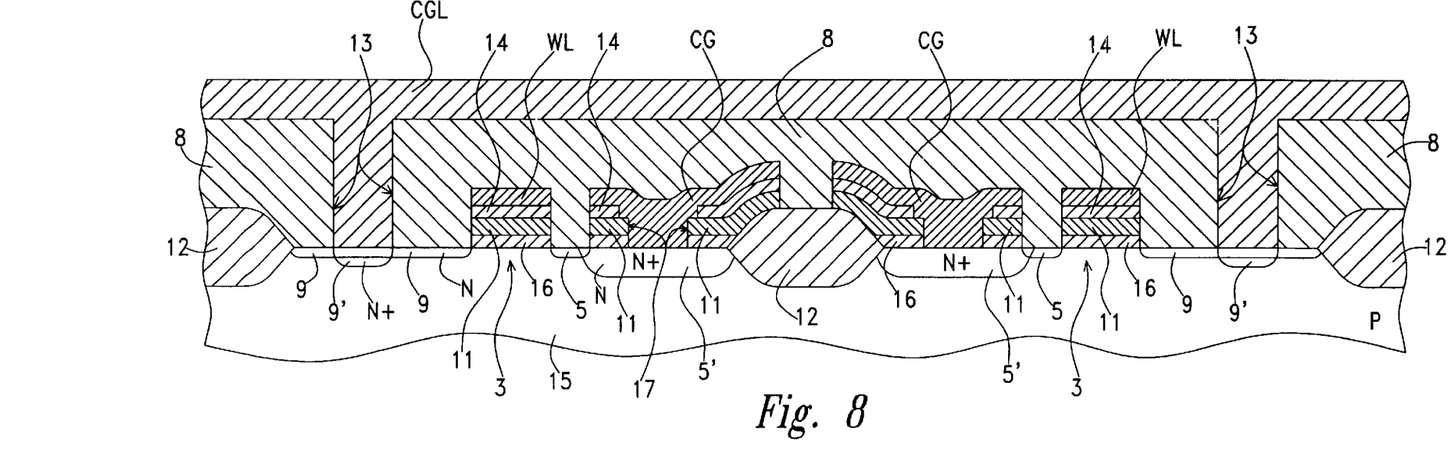
FIG. 8 is a cross-section along line VIII—VIII of FIG. 5.
Figure 9:
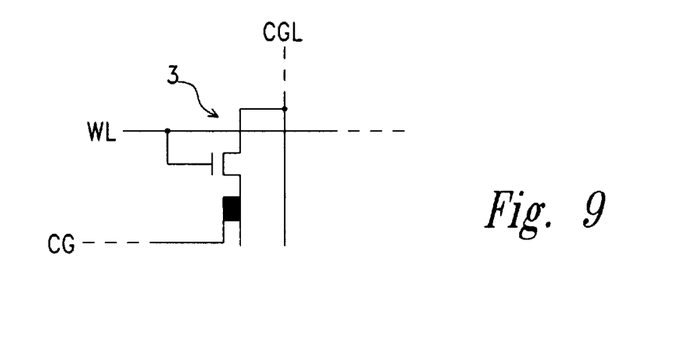
FIG. 9 is a schematic diagram of a byte-switch according to the first embodiment of the invention.
Figure 10:
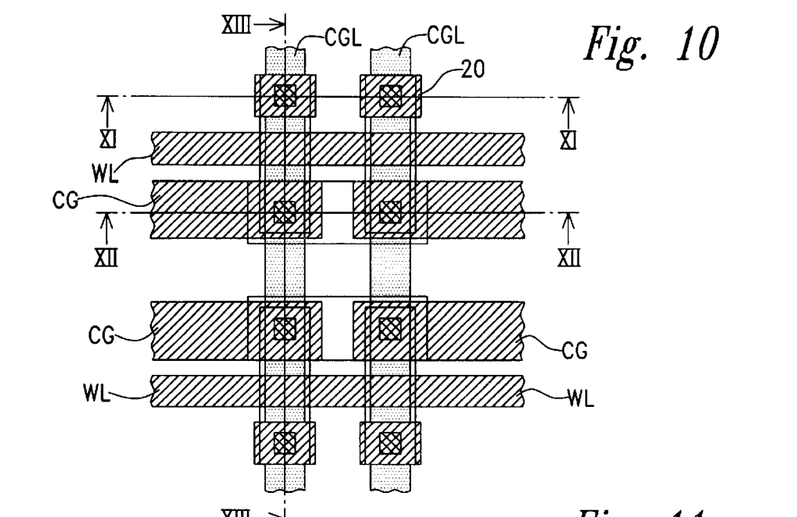
FIG. 10 shows a layout of four byte-switches in accordance with a second embodiment of the invention.
Figure 11:
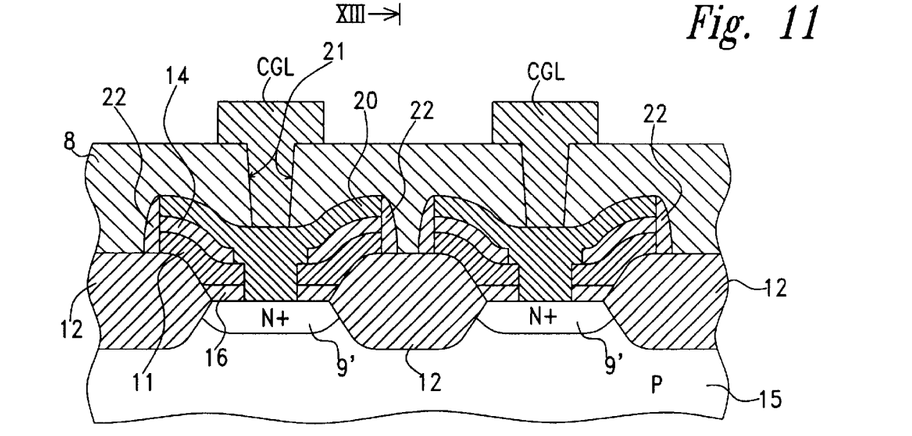
FIG. 11 is a cross-section along line XI—XI of FIG. 10.
Figure 12:
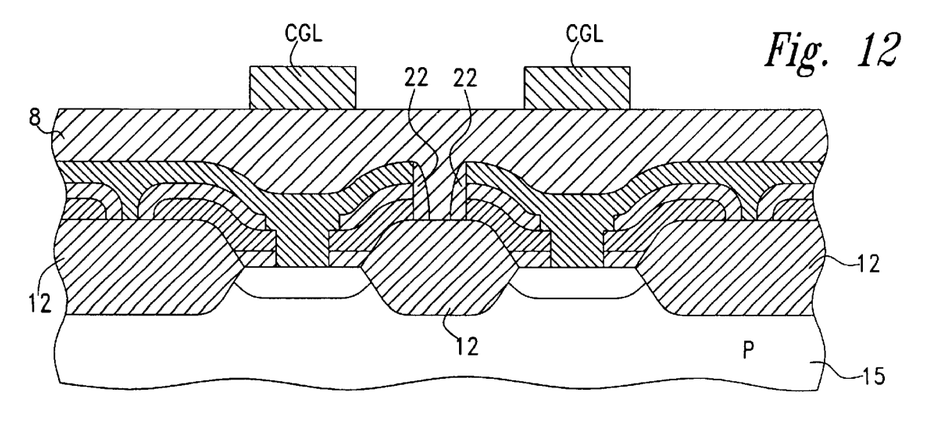
FIG. 12 is a cross-section along line XII—XII of FIG. 10.

A first embodiment of the present invention is shown in FIGS. 5 to 8, and a schematic, electrical representation of the byte-switch according to this first embodiment is depicted in FIG. 9.

It appears that, in contrast to the conventional solution (FIG. 2) where the connection between the N type source region 5 of transistor 3 and the polysilicon byte control gate CG is achieved by means of an aluminum jumper 6, the polysilicon byte control gate CG is in direct contact with the N type source region 5 of transistor 3. The aluminum control gate line CGL is superimposed on the transistor 3 and on the contact region between the polysilicon byte control gate CG and the source region 5 of transistor 3 (FIG. 8). The interlevel dielectric layer 8 electrically isolates the polysilicon byte control gate CG from the aluminum control gate line CGL (FIG. 7).

Figure 6:
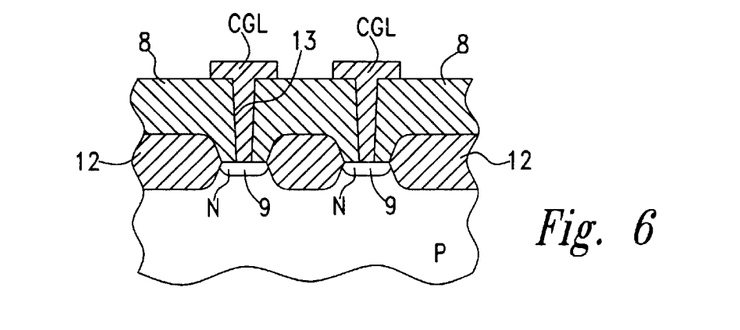
FIG. 6 is a cross-section along line VI—VI of FIG. 5.

More specifically, as shown in FIGS. 6 and 8, the aluminum control gate line CGL directly contacts, through a contact opening 13 in the interlevel dielectric 8, the underlying N type drain region 9 of transistor 3. This is a conventional metalctive area contact, but different from the prior-art byte-switch structure because no lateral extension 7 of the control gate line CGL has to be provided. The contact is aligned with the control gate line CGL. An N+ contact region 9' can be provided in the drain region 9 under the contact opening 13 so as to assure a good ohmic contact. Also, in FIG. 8 the structure of the gate of transistor 3 is visible in detail. The word line WL is formed from an upper polysilicon layer, the same used for forming the byte control gate CG. The upper polysilicon layer is separated from a lower polysilicon layer 11 by a conventional interpoly dielectric layer 14. The lower polysilicon layer 11 is the one used to form the floating gates of the floating-gate MOS transistors 1. The lower polysilicon layer 11 is separated from the substrate 15 by a gate oxide layer 16. The upper polysilicon layer, the interpoly dielectric layer and the lower polysilicon layer 11 run along the direction of the word line WL, and the two polysilicon layers are short-circuited outside the array of memory cells.

As shown in FIGS. 7 and 8, the byte control gate CG, made from the upper polysilicon layer, directly contacts, through a contact opening 17 in the lower polysilicon layer 11, the interpoly dielectric layer 14 and the gate oxide layer 16, the N type source region 5 of transistor 3. More specifically, in order to make the direct contact between the upper polysilicon layer and the active area a good ohmic contact, an N+ region 5' linked to the N type source region 5 is to be provided under the contact opening 17. As will be explained later, this heavily doped region 5' is advantageously formed by means of the same implant provided in the EEPROM manufacturing process for forming N+ regions under the tunnel oxide of the floating-gate MOS transistors 1. Thus, no additional steps are necessary.

The relevant steps for the manufacturing of an EEPROM device including the byte-switch structure according to this embodiment of the invention are outlined below.

First, active areas are defined over the substrate 15 by selectively forming the field oxide regions 12.

Then, a relatively heavy dose of an N type dopant is selectively implanted into the substrate 15, for forming N+ regions under the tunnel oxide of the floating-gate MOS transistor 1 and, simultaneously, the N+ regions 5' where the polysilicon byte control gate CG will contact the active area (i.e., the source regions of transistors 3).

After this, the gate oxide layer 16 and the tunnel oxide of the floating-gate MOS transistors 1 formed.

The lower polysilicon layer 11 is then deposited, and doped to reduce its resistivity.

By using a photolithographic mask, the lower polysilicon layer 11 is then selectively etched to define the floating gates of the floating-gate MOS transistors 1. Simultaneously, the contact openings 17 in the lower polysilicon layer 11 are formed.

The interpoly dielectric layer 14 is subsequently formed. This layer conventionally is a composite layer, such as an Oxide-Nitride-Oxide (ONO) layer.

By using a photolithographic mask, the interpoly dielectric layer 14 is then selectively removed outside the area of the memory cell array. Also, the interpoly dielectric layer 14 is removed from over the contact openings 17. It is to be noted that, where the lower polysilicon layer has been removed and the gate oxide layer is exposed, the etching step will also remove the gate oxide layer 16.

The upper polysilicon layer is then deposited and doped. If desired, a silicide layer can be formed over the upper polysilicon layer to further reduce its resistivity.

Then, by using a photolithographic mask the upper polysilicon layer is selectively etched to define the word lines WL and the byte control gates CG.

The following steps are totally conventional (N–/P– LDD implants for drain-extended N-channel and P-channel MOSFETs; N and P implants for forming the source and drain regions of the N-channel and P-channel MOSFETs, formation of the dielectric layer 8, formation of contact openings in the dielectric layer 8, deposition and definition of the metal layer, etc.).

Thus, it appears that no additional process steps, and in particular no additional photolithographic masks are required for forming the byte-switch structure according to the first embodiment of the invention. It is only required to modify the layout of some of the photolithographic masks already used in the conventional manufacturing process for EEPROM devices. In particular, the masks having a layout that is to be modified are: the mask used for the N+ implant under the tunnel oxide of the floating gate MOS transistors 1: this modification is necessary for the formation of the N+ regions 5' at the source side of transistors 3; the mask used for the selective etching of the lower polysilicon layer: this modification is necessary for removing the lower polysilicon layer from the regions where the direct contact between the byte control gates CG and the source regions 5 of transistors 3 are to be realized; and the mask used for the selective removal of the interpoly dielectric layer: this last modification is necessary to allow etching and removal of the interpoly dielectric layer and the gate oxide layer for forming the contact openings 17. Clearly, compared to the prior art, also the mask used for the openings in the dielectric layer 8 must be changed; this modification is necessary to avoid openings on the source regions 5 of transistor 3 and an CG polysilicon lines. Also the mask used to define the metal interconnections is to be modified to avoid the formation of jumper 6 and the extensions 7 of lines CGL.

In FIGS. 10 to 13 there is shown a byte-switch structure according to a second embodiment of the invention. The respective electrical schematic symbol is given in FIG. 14. As will be explained later, this embodiment is particularly suitable for manufacturing processes providing for a step of salicidation.

Salicidation is a technique used in some technological processes for reducing the resistivity of diffused semiconductor regions. After the definition and doping of the polysilicon, the N–/P– implants for the LDD technique, the N+/P+ implants for forming the source and drain regions of conventional MOSFETs, a metal such as Ti is deposited and made to react with the silicon (both in crystalline form, such as in the active areas of the substrate, and in polycrystalline form such as over the polysilicon). A substantially metallic layer is thus formed, reducing the resistivity of diffusions and of polysilicon interconnections.

However, the use of the salicidation technique is not straightforwardly compatible with the existence of lightly doped diffused regions, such as the lightly doped source and drain regions of drain-extended transistors (also called Lightly-Doped Drain or, shortly, LDD transistors). This is because the reaction between the metal and the silicon causes a not negligible consumption of the latter. The lightly doped regions could thus be completely consumed during such reaction, and the composite substantially metallic layer would be in short circuit with the substrate.

This is in particular the case of the byte-switch transistors. In fact, these transistors have to be biased at rather high voltages in order to allow erasing of the memory cells by Fowler-Nordheim tunneling. To handle such high voltages, lightly doped source and drain diffusions are used.

A known solution provides for using a dedicated mask (referred to as "salicide protect mask") for preventing the deposition of the metal for salicidation over the lightly doped regions in the memory cell array by selectively interposing a material such as silicon dioxide that will not react with the deposited metal. However, this solution is disadvantageous, since the gate electrode of the select transistors 2 (FIG. 1) must inherently be masked by the salicide protect mask since both the drain and the source of the select transistors must be capable of sustaining high voltages. As a result, the benefical effect of forming salicide over the gate of the select transistor is lost.

The second embodiment of the invention, in addition to reducing the area overhead caused by the byte-switches as in the first embodiment, also proves particularly suitable for preventing salicidation of the lightly doped source and drain diffusions of the byte-switch transistors.

As shown in the drawings, differently from the previous embodiment of the invention, the contact between the aluminum control gate line CGL and the underlying N type drain region of transistor 3 is not realized as a direct metal-to-active area contact. Instead, an isle 20 is formed in the upper polysilicon layer forming the byte control gate CG and the word line WL. The control gate line CGL contacts, through an opening 21 in the interlevel dielectric layer 8, the underlying polysilicon isle 20. This latter contacts, through an opening in the underlying interpoly dielectric layer 14, the lower polysilicon layer 11 and the gate oxide layer 16, the N+ region 9' linked to the N type drain region 9 of transistor 3.

Another difference with respect to the previous embodiment is the presence of insulating sidewall spacers 22 at the sides of the word lines WL and the byte control gates CG. As visible in FIG. 13, because the distance between the polysilicon isle 20 and the word line, and between the word line WL and the associated byte control gate CG is deliberately made small, in particular smaller than twice the width of a spacer 22, the lightly doped N type drain region 9 and the lightly doped N type source region 5 of the byte-switch transistor 3 remain completely covered by the spacers 22. This is advantageous, because in a process providing for a salicidation of the silicon and polysilicon, it makes a salicide protection mask over the drain and source regions 9 and 5 of the transistors 3 unnecessary. As explained above, such a protection mask would be required in order to prevent deposition of a metal and subsequent reaction of the metal with the silicon over such lightly doped regions 5 and 9, which are rather shallow and could therefore be completely absorbed during the salicide reaction process.

A manufacturing process suitable for obtaining the second embodiment of byte-switch just described is outlined below, only the relevant steps being discussed.

Initially, field oxide regions 12 and active areas are formed over the substrate 15 according to any conventional technique.

Then, a relatively high dose of an N type dopant is implanted in that active area regions where the tunnel oxide of the floating-gate MOS transistors 1 will be formed. Simultaneously, the relatively high dose of N type dopant is also implanted to form the N+ regions 9' and 5' of transistors 3.

Then the gate oxide layer 16 for the floating-gate MOS transistors 1, the select transistors 2 and the byte-switch transistors 3 is formed, and also the tunnel oxide of the floating-gate MOS transistors 1 is formed.

The lower polysilicon layer is then deposited, and doped.

Then, by means of a photolithographic mask, the lower polysilicon layer is selectively etched to define the floating gates of the MOS transistors 1. Simultaneously, the lower polysilicon layer is also removed from over the N+ regions 9' and 5' of the byte-switch transistors 3, where the upper polysilicon layer will have to contact with the active area.

Then, the interpoly dielectric layer 14 (e.g., ONO composite layer) is formed. By means of a photolithographic mask, such a layer is then selectively removed from the regions where the upper polysilicon layer will have to contact the active area, i.e. the source and drain regions of transistors 3. The photolithographic mask protects all the memory cell matrix area, apart from the source and drain regions of transistors 3. The etching will stop when the substrate is reached, because the etching will also affect the underlying gate oxide layer 16.

Then, the upper polysilicon layer is deposited. The upper polysilicon layer is then selectively etched to form the word lines WL, the byte control gates CG, and the isles 20.

Then, a low dose of N type dopant is selectively implanted to form lightly doped N type source and drain regions (LDD implant), such as regions 5 and 9 of transistors 3.

Figure 13:
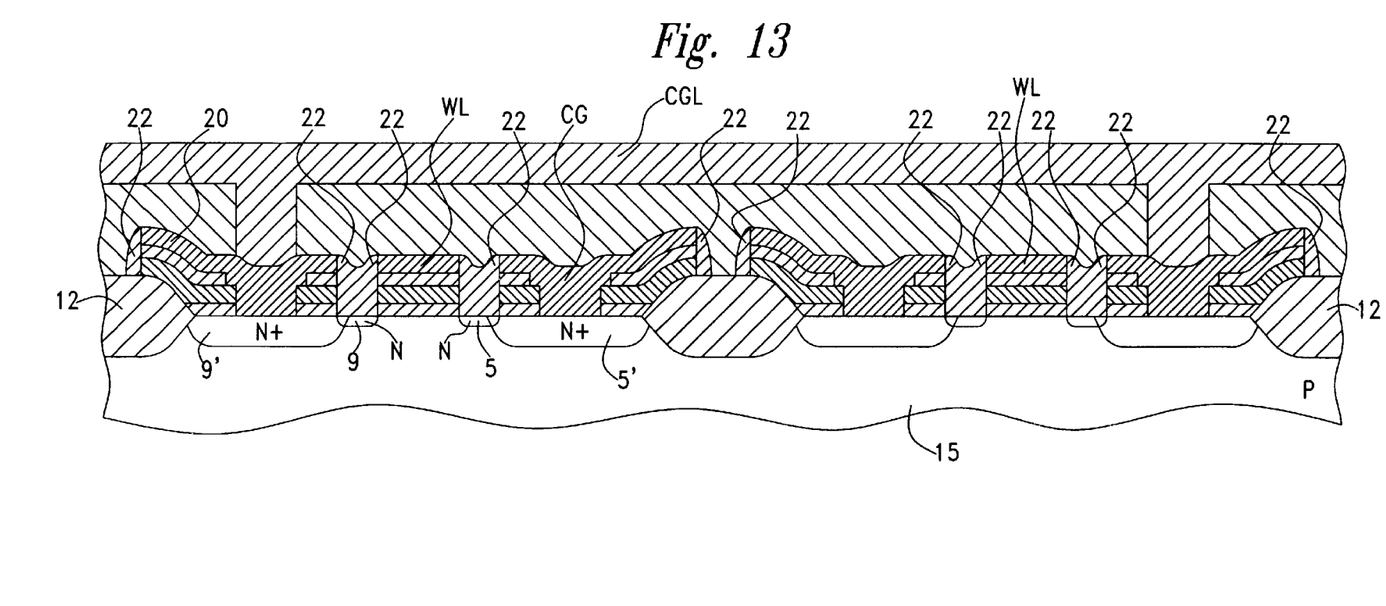
FIG. 13 is a cross-section along line XIII—XIII of FIG. 10.
Figure 14:
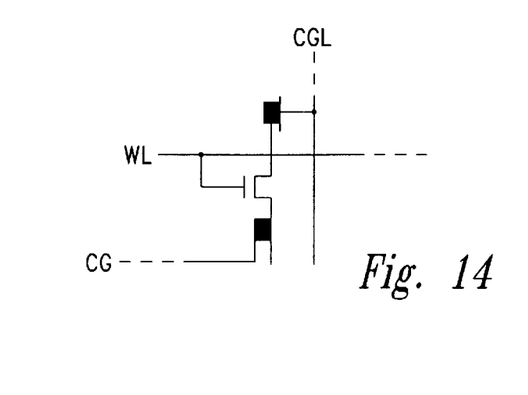
FIG. 14 is a schematic representation of a byte-switch according to the second embodiment of the invention.
Figure 15:
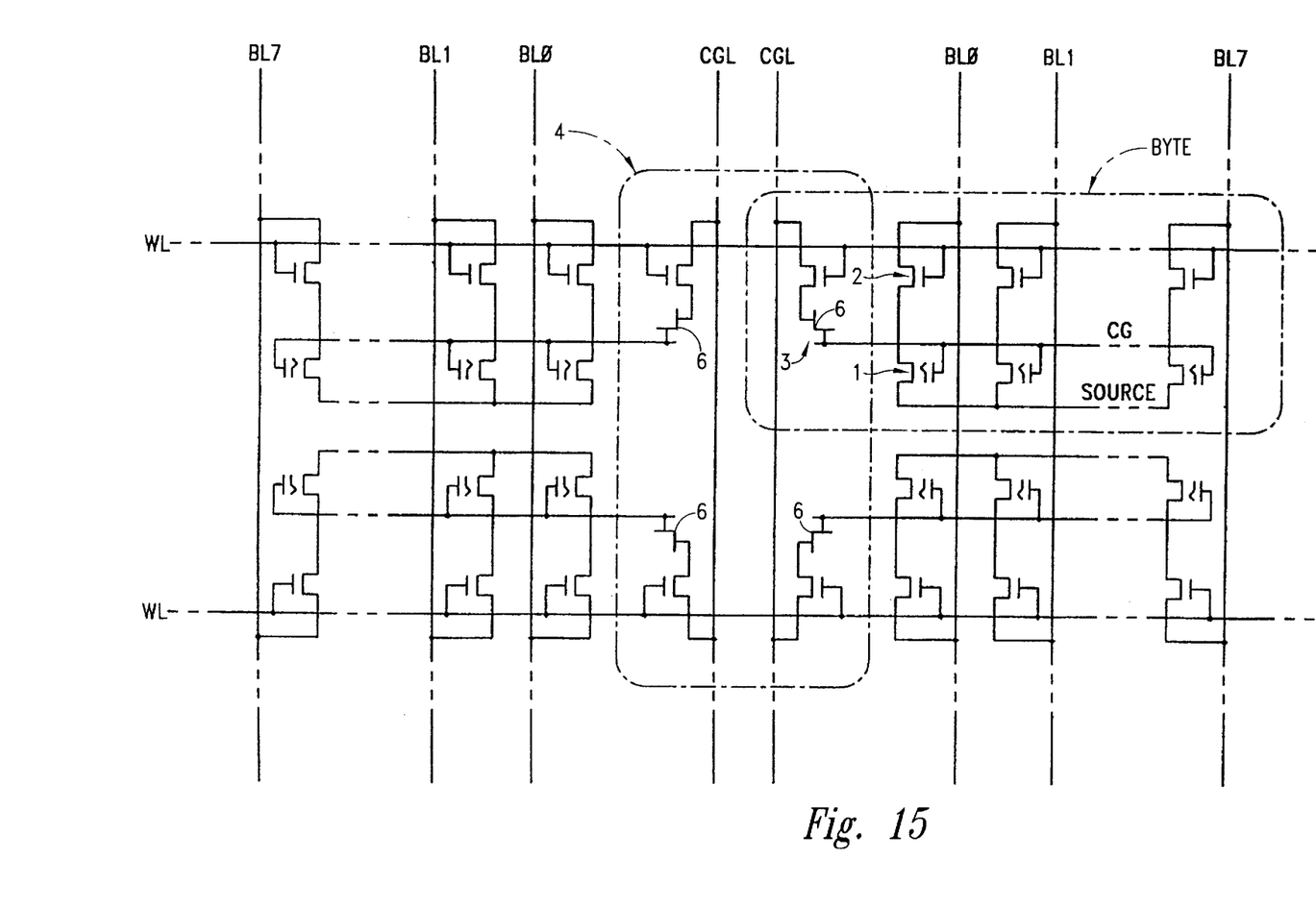
FIG. 15 is a circuit diagram of a portion of an EEPROM memory cell area employing byte switches according to an embodiment of the present invention.

A dielectric material for the formation of the sidewall spacers 22 is then conformally deposited over the whole surface. Then, the deposited dielectric material is etched. Where the distance between adjacent polysilicon structures is small, in particular smaller than twice the width of the spacers, the dielectric is not removed, and the underlying regions remain covered by the dielectric, as shown in FIG. 13. The polysilicon word lines, the polysilicon byte control gates CG, and the polysilicon isles 20 are instead uncovered.

A high dose of an N type dopant is then implanted to form the N+ source and drain regions. In order to form drain-extended (LDD) source and drain junctions, there is no need to provide a mask: in fact, the presence of the spacers 22 already protects the regions that are not to be affected by this implant.

Then, a layer of metal, such as Ti is deposited, and it is made to react with the silicon where the metal is in direct contact with either the substrate or the polysilicon. The remaining of the metal layer is then removed. Clearly, thanks to the fact that the relatively lightly doped regions 5 and 9 of transistors 3 are covered by the dielectric material of the spacers, no metal is deposited over these regions, and no salicide will form. Thus, the objective of preventing the formation of salicide over the lightly doped regions 5 and 9 is attained, without the need of any salicide protect mask.

The intermediate dielectric layer is then deposited, and the contact openings are formed.

The subsequent steps are conventional.

I claim:

1. A byte-switch structure for electrically erasable and programmable non-volatile memories, comprising:
   a MOS transistor having a drain region coupled to a respective metal control gate line, a source region coupled to a respective polysilicon byte control line which is connected to control gate electrodes of all the memory cells of a same memory byte or word and is formed in an upper polysilicon layer, and a gate electrode coupled to a respective word line, said source and drain regions of the MOS transistor being respectively a first and a second doped regions of a first conductivity type formed in a semiconductor layer of a second conductivity type at opposite sides of said respective word line;
   wherein said first and second doped regions are formed under said respective metal control gate line, and
   wherein said polysilicon byte control gate line extends under said metal control gate line to overlap said first doped region, is separated from said metal control gate line by a dielectric layer, and contacts said first doped region through a respective contact opening in an underlying stack formed by an interpoly dielectric layer, a lower polysilicon layer and an oxide layer.

2. The byte-switch structure according to claim 1, wherein said metal control gate line directly contacts said underlying second doped region through a contact opening formed in said dielectric layer.

3. The byte-switch structure according to claim 1, wherein said metal control gate line is coupled to said underlying second doped region by means of a conductive isle formed in the upper polysilicon layer, said isle contacting the underlying second doped region through a respective contact opening in the underlying stack formed by the interpoly dielectric layer, the lower polysilicon layer and the oxide layer, the metal control gate line contacting in turn the isle through a respective contact opening in the dielectric layer.

4. A memory structure including a plurality of EEPROM cells and having a byte-switch structure, the memory structure comprising:
   a control gate line;
   a byte control gate line coupled to control gate electrodes of the memory cells of a given byte;
   a switch MOS transistor having a drain and a drain terminal, a gate and a gate terminal, and a source and a source terminal, the drain terminal coupled to the control gate line, the source terminal coupled to the byte control gate line, and the gate terminal coupled to a respective word line;
   the drain of the switch MOS transistor formed as a first doped region of a first conductivity type formed in a semiconductor layer on a first side of the respective word line, the drain being disposed under the control gate line as perceived from a first direction;
   the source of the switch MOS transistor formed as a second doped region of the first conductivity type formed in the semiconductor layer on a second side of the respective word line, the source being disposed under the control gate line when perceived from the first direction;
   a contact opening disposed between the control gate line and the source, the contact opening structured to electrically couple the source and the byte control gate line and remain insulated from the control gate line; and
   an isle including:
      an insulating layer disposed on the semiconductor layer and over the drain of the switch MOS transistor having an opening therein,
      a lower polysilicon layer disposed on the insulating layer and having an opening therein,
      an interpoly dielectric layer disposed over the lower polysilicon layer and having an opening therein, and
      an upper polysilicon layer disposed over the interpoly dielectric layer;
      wherein the control gate line is coupled to the upper polysilicon layer, and wherein the upper polysilicon layer directly contacts the drain of the switch MOS transistor by extending through the openings in the interpoly dielectric layer, the lower polysilicon layer and the insulating layer.

5. The memory structure of claim 4 wherein the control gate line directly contacts the drain through an opening in a dielectric layer disposed over the byte control gate line.

6. In an EEPROM device having a semiconductor substrate including a plurality of floating gate transistor memory cells made with lower and upper polysilicon layers and having the memory cells of each byte with control gates coupled to one another, a byte-switch transistor comprising:

a drain coupled to a respective control gate line and disposed within the width of the control gate line;

a source disposed within the width of the control gate line, coupled to a respective strip of the upper polysilicon layer, and spaced apart from the drain, a portion of the strip disposed underneath the control gate line when perceived from a first direction; and a contact having an etched lower polysilicon layer, an insulating layer, an interpoly dielectric layer and a part of the strip of upper polysilicon layer such that the part of the polysilicon layer directly contacts the source region of the byte-switch transistor.

7. The byte switch transistor of claim 6 wherein the control gate line is made of a metal.

\* \* \* \* \*